United States Patent
Tzivanopoulos et al.

(10) Patent No.: US 8,981,800 B2
(45) Date of Patent: Mar. 17, 2015

(54) CURRENT SENSOR WITH A SELF-TEST FUNCTION

(75) Inventors: Chrysanthos Tzivanopoulos, Kornwestheim (DE); Dirk Hasenkopf, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 324 days.

(21) Appl. No.: 13/516,344

(22) PCT Filed: Oct. 28, 2010

(86) PCT No.: PCT/EP2010/066291
§ 371 (c)(1),
(2), (4) Date: Aug. 27, 2012

(87) PCT Pub. No.: WO2011/072934
PCT Pub. Date: Jun. 23, 2011

(65) Prior Publication Data
US 2012/0319473 A1    Dec. 20, 2012

(30) Foreign Application Priority Data
Dec. 18, 2009    (DE) .................. 10 2009 054 943

(51) Int. Cl.
*G01R 31/26* (2014.01)
*G01R 15/18* (2006.01)

(52) U.S. Cl.
CPC .................................. *G01R 15/183* (2013.01)
USPC .................. 324/713; 324/117 R; 324/117 H; 324/252; 324/244; 324/127

(58) Field of Classification Search
CPC ...... G01R 33/02; G01R 33/09; G01R 33/093; G01R 19/00; G01R 19/0092; G11B 5/3932; G11B 5/372; G11B 5/376

USPC ................. 324/713, 244–252, 260, 344, 127, 324/117 R, 117 H
See application file for complete search history.

(56) References Cited

U.S. PATENT DOCUMENTS 5,677,604 A    10/1997    Masaki et al.
6,501,241 B1    12/2002    Tsurumi et al.
(Continued)

FOREIGN PATENT DOCUMENTS

DE    42 30 939 A1    3/1994
DE    100 53 440 A1    6/2001
(Continued)

OTHER PUBLICATIONS

International Search Report corresponding to PCT Application No. PCT/EP2010/066291, mailed Feb. 3, 2011 (German and English language document) (8 pages).

*Primary Examiner* — Tung X Nguyen
*Assistant Examiner* — Son Le
(74) *Attorney, Agent, or Firm* — Maginot, Moore & Beck LLP

(57) ABSTRACT

A current sensor includes a core arranged around a conductor, a sensing element arranged on the core and configured to generate an output variable dependent on a magnetic field in the core, and a measuring unit configured to detect the output variable and to derive a measured value of the current. The current sensor further includes a test coil arranged around the core and a test current generator connected to the test coil. The test current generator is configured to generate a test current signal of a specified amplitude and to output the test current signal to the test coil. The current sensor further includes a testing unit connected to both the measuring unit and the test current generator and configured to output information regarding the current sensor. The information is output as a test signal dependent upon comparing a first and a second measured value.

8 Claims, 3 Drawing Sheets

(56) References Cited

U.S. PATENT DOCUMENTS

| | | |
|---|---|---|
| 6,734,660 B1 | 5/2004 | Berkcan et al. |
| 2008/0224709 A1* | 9/2008 | Tae et al. .................. 324/430 |

FOREIGN PATENT DOCUMENTS

| | | | |
|---|---|---|---|
| DE | 103 31 883 A1 | 2/2005 | |
| DE | 10 2008 030 411 A1 | 1/2009 | |
| EP | 1 956 384 A2 | 8/2008 | |
| GB | 2 228 337 A | 8/1990 | |
| GB | 2228337 A * | 8/1990 | ............ G01R 15/02 |
| JP | 2001-121974 A | 5/2001 | |
| JP | 2006-345683 A | 12/2006 | |
| JP | 2007-139459 A | 6/2007 | |
| WO | 2006113459 A2 | 10/2006 | |

* cited by examiner

CURRENT SENSOR WITH A SELF-TEST FUNCTION

This application is a 35 U.S.C. §371 National Stage Application of PCT/EP2010/066291, filed on Oct. 28, 2010, which claims the benefit of priority to Ser. No. DE 10 2009 054 943.9, filed on Dec. 18, 2009 in Germany, the disclosures of which are incorporated herein by reference in their entirely.

BACKGROUND

The disclosure relates to a current sensor having a self-test function which ensures that the current sensor operates properly, that is to say the measured values measured by the current sensor are reliable. Such a current sensor is particularly suitable for critical applications, for example for monitoring the battery current in a motor vehicle having a battery module and an electrical drive motor. A second aspect of the disclosure is directed to such a motor vehicle which may be in the form of a microhybrid, a mild hybrid or a full hybrid vehicle or else a pure electric vehicle, for example.

Battery systems for use in motor vehicles of the abovementioned types for providing energy for the drive are called "high-voltage batteries" in order to distinguish them from starter batteries for starting an internal combustion engine. Although vehicles having high-voltage batteries are not yet widespread on the market, a certain prior art has already evolved with regard to the safety components which are required in order to ensure safe operation of the high-voltage battery. FIG. 1 shows a high-voltage battery having safety components required according to the present prior art. The high-voltage battery 10 has a multiplicity of battery cells which are connected in series and are intended to generate the desired high output voltage. The individual cells are monitored by so-called cell sense and control units (CSCs) 11 in order to test their state of charge and avoid overcharging or undercharging of the battery cells. The output voltage from the high-voltage battery 10 is monitored by a total voltage detection means 12a on the battery side. A further total voltage detection means 12b is provided on the drive side. A fuse 13 which opens the circuit in the event of impermissibly high currents is inserted into one of the two current paths. A current sensor for detecting the battery current is also inserted into one of the two current paths. Power contactors 15a and 15b are also provided in each of the two current paths in order to be able to switch the high-voltage power supply system of the motor vehicle such that it is not live, for example in an emergency or for a maintenance measure. A charging current path having a charging contactor 16 and a charging resistor 17 for limiting the charging current are also provided, for example, in parallel with the power contactor 15a in FIG. 1.

The current sensor 14, in particular, is very important when monitoring the proper operation of the high-voltage battery system. The measurement variable recorded by the current sensor 14 is used, for example, to detect impermissibly high battery currents and, if necessary, to take countermeasures in order to keep the system in a safe operating state. The instantaneous state of charge of the high-voltage battery is also calculated from the measured current by means of suitable methods. In addition, the high-voltage battery could be overcharged or undercharged, which entails harmful or even dangerous states of the high-voltage battery.

A plurality of methods exist for detecting the battery current, for example:
measurement by means of a voltage drop across a resistor (shunt principle)
measurement by means of transformers on the basis of the induction principle
measurement by means of Rogowski coils on the basis of the induction principle
measurement of the magnetic field generated by the battery current, for example by means of Hall sensors, magnetoresistive sensors (AMR, GMR)

A plurality of requirements are imposed on the detection of the battery current, for example a sufficiently high accuracy and bandwidth. The important factor in high-voltage battery systems is also sufficient DC isolation between the high-voltage vehicle power supply system, the measuring electronics and the low-voltage vehicle power supply system (if appropriate with the starter battery) in order to protect the vehicle occupants from hazardous shock currents in the event of a defect in the electronics.

At the same time, the costs of a current sensor are intended to be as low as possible in order to be able to offer the overall system at prices in line with the market. Redundancy by using a plurality of current sensors is therefore not very attractive in economical terms, especially since, when using only two current sensors, it would also not be clear, in the event of differing measured values from the two current sensors, which current sensor is operating correctly and which is not.

The aim of the disclosure is to overcome the abovementioned problems of the prior art.

SUMMARY

A first aspect of the disclosure therefore introduces a current sensor for measuring a current in a conductor using a magnetic field generated by the current, which current sensor at least comprises a core which is arranged around the conductor and is preferably made of a magnetic material, a sensor element which is arranged on the core and a measuring unit. The sensor element is designed to generate an output variable which is dependent on a magnetic field in the core. The measuring unit is designed to detect the output variable and to derive a measured value of the current in the conductor from the detected output variable. According to the disclosure, the current generator also has a test winding which is arranged around the core, a test current generator which is connected to the test winding and a testing unit. In this case, the test current generator is designed to generate a test current signal of a predetermined amplitude in response to a control signal and to output said test current signal to the test winding. The testing unit is connected to the measuring unit and to the test current generator and is designed to receive a first measured value from the measuring unit at a first point in time, to output the control signal to the test current generator at a second point in time following the first point in time, to receive a second measured value from the measuring unit at the second point in time or at a third point in time following the second point in time, to compare the first measured value with the second measured value and, on the basis of a result of the comparison of the first and second measured values, to output an item of information relating to whether the current sensor is operating properly as a test signal.

The disclosure is based on the insight that a plausibility check of the measured value recorded by the current sensor becomes possible if a given measurement scenario is modified in a known manner and a second measured value recorded in the modified measurement scenario is used for comparison. The disclosure therefore provides a test current generator which changes the magnetic field measured by the sensor element in the core by a predetermined amount (for example increases it), with the result that it is possible to check whether the output variable or the measured value resulting from the latter also changes accordingly. If the measured value does not change in the expected manner, incorrect current measurement is at least likely and appropriate safety measures may be taken, if necessary. In order to obtain a higher degree of safety, it goes without saying that it is also possible to wait for the results from a plurality of measurement cycles.

The testing unit is preferably designed to determine a pair of estimated values on the basis of the first measured value and to output an item of information which indicates proper operation of the current sensor if the second measured value is within a range defined by the pair of estimated values. This embodiment of the disclosure takes into account the fact that the measurement variable itself can change between the first measurement and the test measurement, for instance because there is a changed operating state of a motor vehicle in which the current sensor is used, for example. However, since the measurement variable can only change at a finite rate and this rate of change is limited, for example, by inductances in the high-voltage vehicle power supply system, it is possible to determine or predefine a margin within which the second measured value must lie despite an assumed maximum rate of change of the measurement variable. The pair of estimated values is preferably variably determined by the testing unit using the magnitude of the first measured value, with the result that, for example, non-linearities in the measurement or, depending on the operating state, different rates of change of the measurement variable can be taken into account.

The test current generator is preferably designed to generate a test current signal with an amplitude of at least one predefined maximum current to be measured in the conductor divided by a number of windings of the test winding around the core. In this manner, there is no need to generate a test current signal with a large amplitude in order to be able to cover the entire measurement range of the current sensor, which minimizes the power consumption of the additional circuit measures of the disclosure.

The test current generator may be designed to generate a stepped, sawtooth, triangular, sinusoidal or square-wave test current signal.

Owing to the simple signal processing, preference is given to a sensor element which is designed to generate an output voltage as an output variable. The current sensor preferably has an amplifier and an A/D converter, the amplifier being designed to amplify the output voltage and to output it to the A/D converter.

All embodiments of the current sensor may have a compensation winding which is arranged around the core and a compensation circuit, the compensation circuit being designed to generate a compensation current on the basis of a third measured value measured at a third point in time before the first point in time and to output said current to the compensation winding during the first point in time and the second point in time. This makes it possible to generate a compensation magnetic field in the core in order to shift the measurement variable into a range in which the sensor element has particularly high linearity.

A second aspect of the disclosure relates to a motor vehicle having an electrical drive motor, a battery module connected to the electrical drive motor and a current sensor for measuring a current flowing between the battery module and the electrical drive motor. According to the disclosure, the current sensor is a current sensor according to the first aspect of the disclosure.

Preference is given to a motor vehicle in which the battery module is connected to the electrical drive motor via at least one contactor which is designed to disconnect the battery module from the electrical drive motor in response to a test signal from the current sensor, which signal indicates improper operation of the current sensor.

BRIEF DESCRIPTION OF THE DRAWINGS

The disclosure is explained in more detail below using figures of exemplary embodiments, in which.

DETAILED DESCRIPTION

Figure 1:
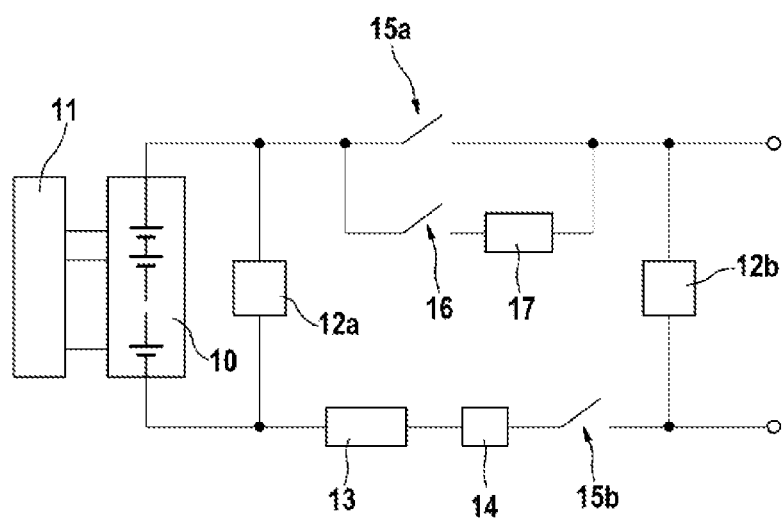
FIG. 1 shows a high-voltage battery with safety components.
Figure 2:
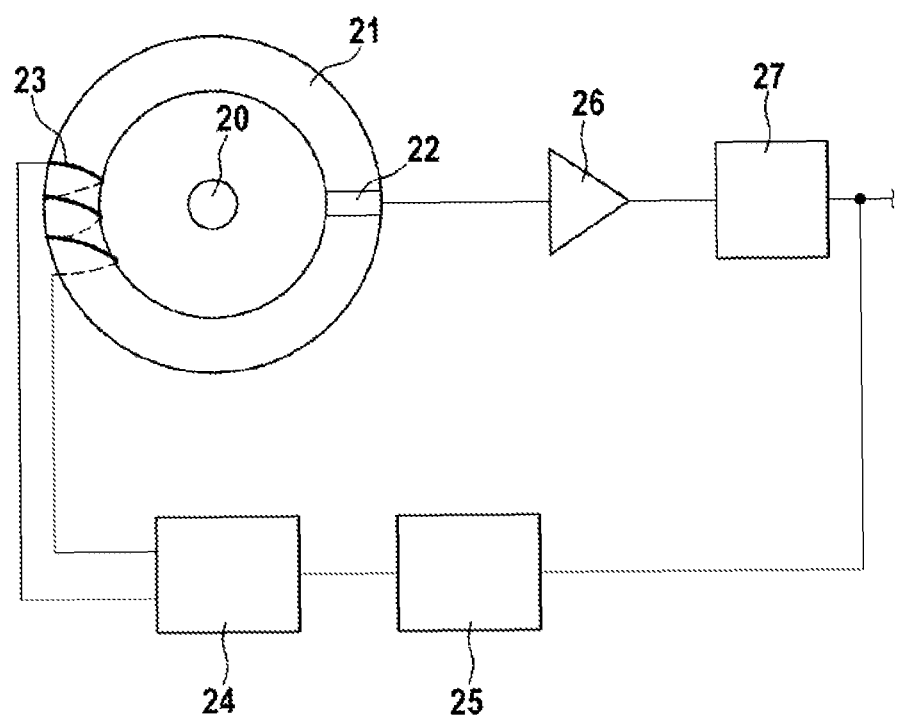
FIG. 2 shows a current sensor according to the disclosure.

FIG. 2 shows a current sensor according to the disclosure. A core 21 is arranged around an electrical conductor 20 which runs along the image perpendicular and in which the current to be measured flows, a magnetic field generated by the current flowing in the conductor 20 building up in said core. A sensor element 22 which generates an output variable dependent on the magnetic field and outputs said variable for further processing is arranged on the core 21. FIG. 2 shows, by way of example, an amplifier 26 and an analog/digital converter 27 which amplify an electrical variable output output variable and convert it into a digital measured value and thus act as a measuring unit. However, the measuring unit may also be integrated in the sensor element 22. Instead of the amplifier 26 and the analog/digital converter 27, however, other components for processing the output variable from the sensor element 22 may also be provided.

A test winding 23 which has a number $w_p$ of turns and is connected to a test current generator 24 is also arranged around the core 21. The test current generator 24 has a control input for a control signal, which is connected to a testing unit 25, and is designed to generate a test current signal in response to the control signal and to output said test current signal to the test winding 23. The test winding 23 thus generates an additional magnetic field in the core 21, which magnetic field is superimposed on the magnetic field generated by the current flowing in the conductor 20, as a result of which the output variable from the sensor element 22 must also accordingly change when the current sensor is operating properly. The testing unit 25 is connected to the sensor element 22 via the measuring unit and, for a given operating condition, can now compare a measurement when the test current generator 24 is inactive with a measurement when the test current generator 24 is active and can thus check whether the output variable from the sensor element 22 changes, as expected, with the test current signal from the test current generator 24. In the example in FIG. 2, the testing unit 25 is connected to the sensor element 22 via the amplifier 26 and the analog/digital converter 27, which act as a measuring unit, but it is also possible to directly connect the testing unit 25 to the sensor element 22 or to integrate the measuring unit in the testing unit 25. When using the analog/digital converter 27, the function of the testing unit 25 could be purely digital and could be undertaken by another microcontroller or the like present in the system, which minimizes the outlay for additional components.

In order to be able to check the largest possible part of the transfer characteristic of the current sensor, the test current should be able to cover the same range [Bmin, Bmax] of induction density B in the core 21 as the current I generates in the conductor 20 in the range [Imin, Imax]. As a result of the freely selectable number of turns $w_p$ in the test winding 23, the test current generator 24 only needs to be able to generate a test current signal in the range $[I_{min}/w_p, I_{max}/w_p]$, which considerably simplifies the technical implementation, in particular in the case of large currents I in the conductor 20.

In order to also be able to use the test method in the case of variable currents in the conductor 20, a pair of estimated values can be calculated on the basis of a first measured value $A_1$ measured at a point in time to, between which estimated values a second measured value $A_2$ recorded when the test current generator 24 is active at a point in time t1 later by a period $\Delta T$ must be expected to lie (t1=t0+$\Delta T$). Since a maximum rate of change of the current I can be determined from the electrical parameters applicable to a respective environment and $\Delta T$ can be selected to be very small in practical technical implementations, it is possible to determine a maximum change $\Delta A$ of the output variable A from the sensor element 22 (or from the signal processing chain adjoining the sensor element 22), which change may result from the maximum possible change $\Delta I$ in the current I in the period $\Delta T$. The second measured value may now be assessed additionally taking into account $\Delta A$ and, during proper operation, should be between the output variables $A_{est1}$ and $A_{est2}$ to be expected for a total current of $I_{est1}=I+\Delta I+I_{test}$ and $I_{est2}=I-\Delta I+I_{test}$. In the case of a linear behavior of the current sensor, the output variables $A_{est1}$ and $A_{est2}$ to be expected may be determined by means of simple extrapolation, otherwise a characteristic curve of the current sensor stored in the testing unit, for example in the form of a table, could be used.

In general, it is possible to use a test current signal with a constant magnitude (amplitude) and a constant profile. However, better results are achieved if the magnitude of the test current signal is varied or else is determined on the basis of the first measured value. Further measured values may also be used for testing with a test current signal which is changed in each case. A test current signal may thus scan a larger range of values, and a plurality of measurements or measurement pairs of first and second measured values may be carried out while the range of values is being scanned in order to improve the result of the diagnosis. In such a method, it may also be possible to detect changes in the characteristic curve of the current sensor which are caused by ageing of components of the current sensor, for example.

Figure 3:
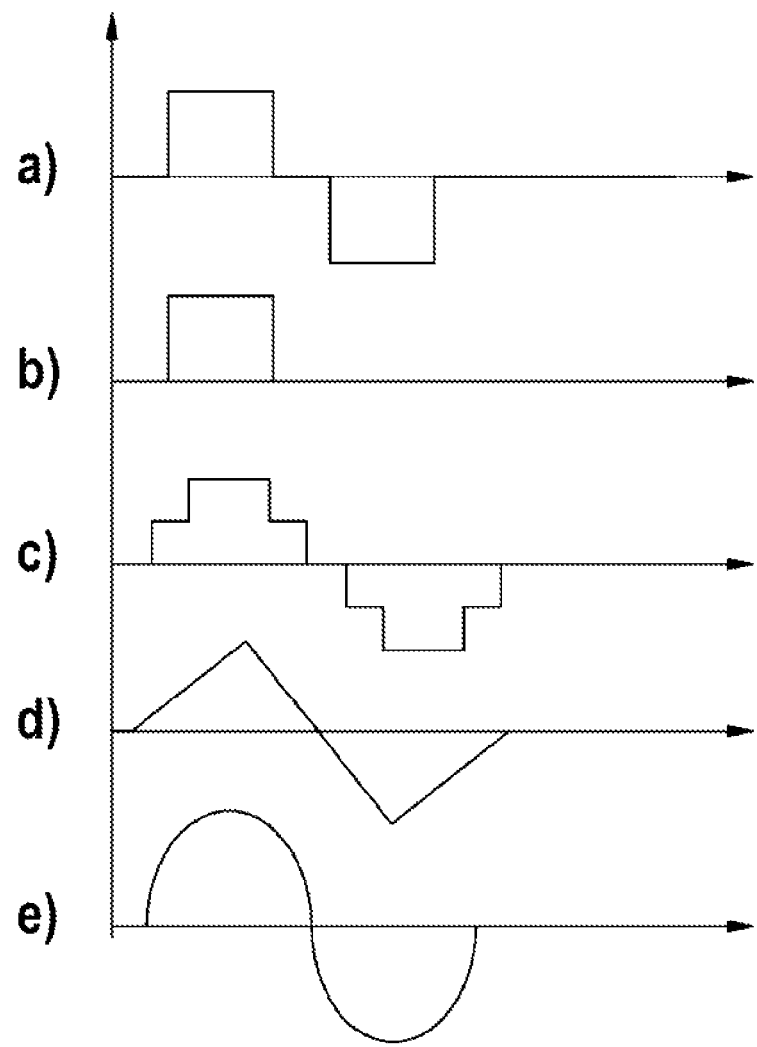
FIG. 3 shows examples of possible test current signals.

FIG. 3 shows some examples of possible test current signals. The test current signals may have a bipolar or unipolar square-wave shape, as illustrated in diagrams a) and b), a stepped shape (diagram c)), a sawtooth shape, a triangular shape (diagram d)) or a sinusoidal shape (diagram e)). Alternatively, many other shapes are conceivable.

The measuring method in the disclosure may, in principle, be carried out in any operating state if the current sensor is used in a motor vehicle, that is to say before, during or after the journey. In this case, the test sequence may be triggered on the basis of the instantaneous current in order to carry out a test for a current for which a relatively long period has already passed since the last test, with the result that the largest possible part of the entire range [Imin, Imax] of possible input current values of the current sensor is checked.

The invention claimed is:

1. A current sensor for measuring a current in a conductor using a magnetic field generated by the current, comprising:
 a core formed from a magnetic material arranged around the conductor;
 a sensor element arranged on the core and configured to generate an output variable dependent on a magnetic field in the core;
 a measuring unit configured to detect the output variable and to derive a measured value of the current in the conductor from the detected output variable;
 a test winding arranged around the core;
 a test current generator connected to the test winding and configured to generate a test current signal of a predetermined amplitude in response to a control signal and to output the test current signal to the test winding; and
 a testing unit connected to the measuring unit and to the test current generator, the testing unit being configured to:
  receive a first measured value from the measuring unit at a first point in time;
  output the control signal to the test current generator at a second point in time following the first point in time;
  receive a second measured value from the measuring unit in response to outputting the control signal;
  determine a pair of estimated values on the basis of the first measured value; and
  output an item of information relating to whether the current sensor is operating properly as a test signal in response to the second measured value being within a range defined by the pair of estimated values.

2. The current sensor from claim 1, wherein the test current generator is configured to generate a test current signal with an amplitude of at least one predefined maximum current to be measured in the conductor divided by a number of windings of the test winding around the core.

3. The current sensor from claim 1, wherein the test current generator is configured to generate a stepped, sawtooth, triangular, sinusoidal or square-wave test current signal.

4. The current sensor from claim 1, wherein the sensor element is configured to generate an output voltage as an output variable.

5. The current sensor from claim 4, wherein the measuring unit has an amplifier and an A/D converter, the amplifier being configured to amplify the output voltage and to output the output voltage to the A/D converter.

6. The current sensor from claim 1, further comprising:
 a compensation winding arranged around the core; and
 a test current generator configured to generate a compensation current on the basis of a third measured value measured at a third point in time before the first point in time and to output the current to the compensation winding during the first point in time and the second point in time.

7. A motor vehicle, comprising:
 an electrical drive motor,
 a battery module connected to the electrical drive motor, and
 a current sensor for measuring a current flowing between the battery module and the electrical drive motor, the current sensor including:
  a core, formed from a magnetic material, arranged around a conductor;
  a sensor element arranged on the core and configured to generate an output variable dependent on a magnetic field in the core;
  a measuring unit configured to detect the output variable and to derive a measured value of the current in the conductor from the detected output variable;
  a test winding arranged around the core;
  a test current generator connected to the test winding and configured to generate a test current signal of a predetermined amplitude in response to a control signal and to output the test current signal to the test winding; and a testing unit connected to the measuring unit and to the test current generator the testing unit being configured to:
receive a first measured value from the measuring unit at a first point in time;
output the control signal to the test current generator at a second point in time following the first point in time;
receive a second measured value from the measuring unit in response to outputting the control signal;
determine a pair of estimated values on the basis of the first measured value;
generate a first output indicating that the current sensor in response to the second measurement value being with a range defined by the pair of estimated values; and
generate a second output indicating that the current sensor is non-operational in response to the second measurement value being outside the range defined by the pair of estimated values.

8. The motor vehicle from claim 7, wherein the battery module is connected to the electrical drive motor via at least one contactor configured to disconnect the battery module from the electrical drive motor in response to a test signal from the current sensor, the signal indicating the current sensor is non-operational.

* * * * *